(12) United States Patent
Lin et al.

(10) Patent No.: US 9,287,336 B2
(45) Date of Patent: Mar. 15, 2016

(54) DISPLAYS WITH SHARED FLEXIBLE SUBSTRATES

(71) Applicant: Apple Inc., Cupertino, CA (US)

(72) Inventors: Wey-Jiun Lin, Los Altos Hills, CA (US); Sang Youn, Cupertino, CA (US); Sang Ha Kim, Dublin, CA (US)

(73) Assignee: Apple Inc., Cupertino, CA (US)

( * ) Notice: Subject to any disclaimer, the term of this patent is extended or adjusted under 35 U.S.C. 154(b) by 17 days.

(21) Appl. No.: 14/172,488

(22) Filed: Feb. 4, 2014

(65) Prior Publication Data

US 2014/0239276 A1 Aug. 28, 2014

Related U.S. Application Data

(60) Provisional application No. 61/769,686, filed on Feb. 26, 2013.

(51) Int. Cl.
*H01L 27/32* (2006.01)

(52) U.S. Cl.
CPC ......... *H01L 27/3244* (2013.01); *H01L 2227/32* (2013.01)

(58) Field of Classification Search
CPC .................. H01L 27/3244; H01L 2227/32
USPC ............................................................. 257/40
See application file for complete search history.

(56) References Cited

U.S. PATENT DOCUMENTS

| | | | |
|---|---|---|---|
| 7,705,812 B2 | 4/2010 | Yuda et al. | |
| 7,859,633 B2 | 12/2010 | Park | |
| 9,029,886 B2 * | 5/2015 | Namkung | ........... H01L 27/3244 257/95 |
| 2008/0108393 A1 | 5/2008 | Kim | |
| 2008/0137166 A1 | 6/2008 | Sah | |
| 2010/0201261 A1* | 8/2010 | Kwack | ................... H05B 33/04 313/504 |
| 2011/0007042 A1* | 1/2011 | Miyaguchi | ........ G02F 1/133305 345/204 |
| 2012/0146886 A1 | 6/2012 | Minami et al. | |
| 2013/0082984 A1 | 4/2013 | Drzaic et al. | |
| 2013/0279088 A1 | 10/2013 | Raff et al. | |
| 2014/0002385 A1* | 1/2014 | Ka et al. | ........................ 345/173 |
| 2014/0042397 A1* | 2/2014 | Cho | ................... H01L 51/0001 257/40 |
| 2014/0092338 A1 | 4/2014 | Miyazaki et al. | |
| 2014/0145155 A1* | 5/2014 | Park | ..................... H01L 27/3244 257/40 |
| 2014/0203703 A1* | 7/2014 | Maatta | .......................... 313/504 |
| 2014/0217373 A1* | 8/2014 | Youn et al. | ...................... 257/40 |
| 2014/0217382 A1* | 8/2014 | Kwon et al. | .................... 257/40 |

* cited by examiner

*Primary Examiner* — Peter Bradford
(74) *Attorney, Agent, or Firm* — Treyz Law Group, P.C.; Kendall P. Woodruff

(57) ABSTRACT

An electronic device may be provided with a display such as an organic light-emitting diode display. The display may include an array of display pixels formed on a polymer substrate layer. The polymer substrate layer may include an contiguous layer of polyimide that forms a substrate layer in additional structures such as a polymer film and a flexible printed circuit. A first transition region may be interposed between the display and the polymer film, and a second transition region may be interposed between the polymer film and the flexible printed circuit. Metal traces may be formed on the polymer film and on the flexible printed circuit. A display driver integrated circuit may be mounted to the traces on the polymer film. The polymer film may form a U-shaped bend. The flexible printed circuit may be coupled to a printed circuit board in the device using hot bar solder connections.

19 Claims, 9 Drawing Sheets

US 9,287,336 B2

DISPLAYS WITH SHARED FLEXIBLE SUBSTRATES

This application claims the benefit of provisional patent application No. 61/769,686, filed Feb. 26, 2013, which is hereby incorporated by reference herein in its entirety.

BACKGROUND

This relates generally to electronic devices, and more particularly, to electronic devices with displays.

Electronic devices often include displays. For example, cellular telephones and portable computers often include displays for presenting information to a user. An electronic device may have a housing such as a housing formed from plastic or metal. Components for the electronic device such as display components may be mounted in the housing.

It can be challenging to incorporate a display into the housing of an electronic device. Size and weight are often important considerations in designing electronic devices. If care is not taken, displays may be bulky or may be surrounded by overly large borders. The housing of an electronic device can be adjusted to accommodate a bulky display with large borders, but this can lead to undesirable enlargement of the size and weight of the housing and unappealing device aesthetics.

It would therefore be desirable to be able to provide improved displays for electronic devices.

SUMMARY

An electronic device may be provided with a display such as a light-emitting diode display. The light-emitting diode display may include an array of organic light-emitting diode display pixels formed on a substrate such as a polymer substrate layer. The polymer substrate layer may extend out from the display and may form a layer in additional structures in the electronic device such as a polymer film and a flexible printed circuit.

The polymer substrate layer may be a contiguous layer of polyimide having a first region that forms a display substrate layer in the display, a second region that forms a polymer film substrate layer in a polymer film, and a third region that forms a flexible printed circuit layer in a flexible printed circuit.

A first transition region may be interposed between the display and the polymer film. A second transition region may be interposed between the polymer film and the flexible printed circuit.

The first transition region may include layers that are shared with the display and may include layers that are shared with the polymer film such as one or more layers of metal. For this reason, the first transition region may be thicker than the polymer film.

The second transition region may include layers that are shared with the polymer film and may include layers that are shared with the flexible printed circuit. For this reason, the second transition region may be thicker than the polymer film and may be thicker than the flexible printed circuit.

The polymer film may include one or more layers of metal and the flexible printed circuit may include one or more layers of metal. The flexible printed circuit may, for example, include more layers of metal than the polymer film. The flexible printed circuit may include metal layers formed on one surface of the shared flexible polymer substrate layer and additional metal layers formed on an opposing surface of the shared flexible polymer substrate layer. Vertical conductive structures such as conductive vias may be used to form electrical connections between metal layers in the flexible printed circuit.

The array of display pixels may be formed on a first region of the flexible polymer substrate layer and a plurality of metal traces may be formed in a second region of the flexible substrate layer. A display driver integrated circuit may be mounted to the metal traces in the second region. The flexible polymer substrate layer may include U-shaped bend such that the first region of the flexible polymer substrate layer overlaps the display driver integrated circuit in the second region of the flexible polymer substrate layer. At least a portion of the display may overlap the display driver integrated circuit.

Further features of the invention, its nature and various advantages will be more apparent from the accompanying drawings and the following detailed description of the preferred embodiments.

DETAILED DESCRIPTION

Electronic devices may include displays. The displays may be used to display images to a user. Illustrative electronic devices that may be provided with displays are shown in FIGS. 1, 2, 3, and 4.

Figure 1:
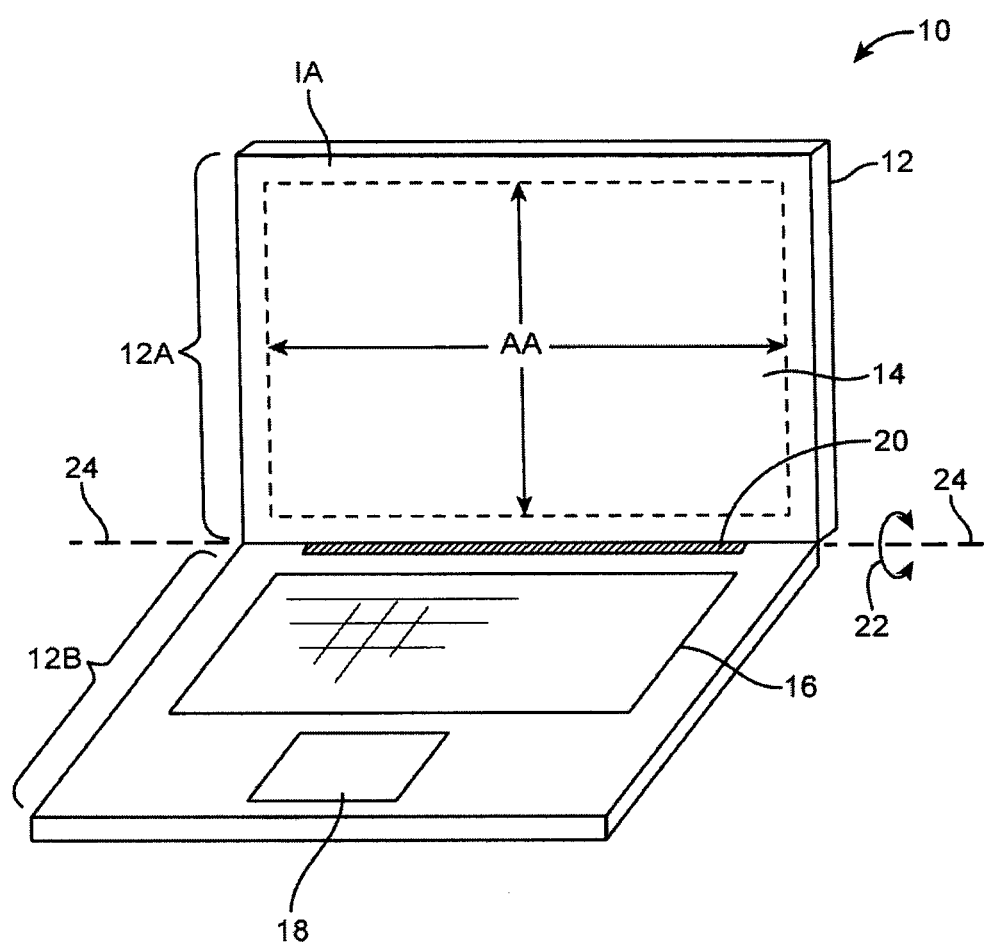
FIG. 1 is a perspective view of an illustrative electronic device such as a laptop computer with a display in accordance with an embodiment of the present invention.

FIG. 1 shows how electronic device 10 may have the shape of a laptop computer having upper housing 12A and lower housing 12B with components such as keyboard 16 and touchpad 18. Device 10 may have hinge structures 20 that allow upper housing 12A to rotate in directions 22 about rotational axis 24 relative to lower housing 12B. Display 14 may be mounted in upper housing 12A. Upper housing 12A, which may sometimes referred to as a display housing or lid, may be placed in a closed position by rotating upper housing 12A towards lower housing 12B about rotational axis 24.

Figure 2:
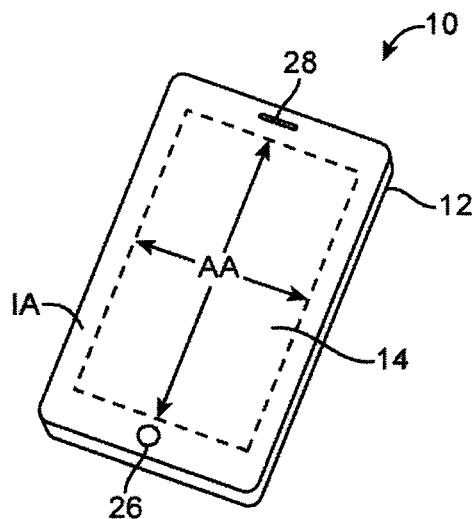
FIG. 2 is a perspective view of an illustrative electronic device such as a handheld electronic device with a display in accordance with an embodiment of the present invention.

FIG. 2 shows how electronic device 10 may be a handheld device such as a cellular telephone, music player, gaming device, navigation unit, or other compact device. In this type of configuration for device 10, housing 12 may have opposing front and rear surfaces. Display 14 may be mounted on a front face of housing 12. Display 14 may, if desired, have openings for components such as button 26. Openings may also be formed in display 14 to accommodate a speaker port (see, e.g., speaker port 28 of FIG. 2).

Figure 3:
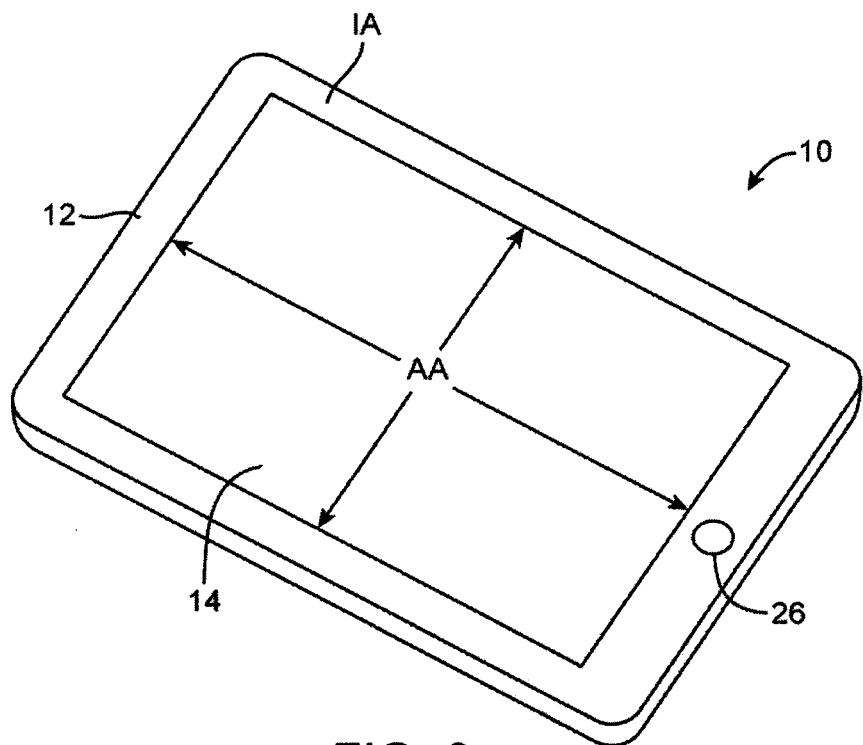
FIG. 3 is a perspective view of an illustrative electronic device such as a tablet computer with a display in accordance with an embodiment of the present invention.

FIG. 3 shows how electronic device 10 may be a tablet computer. In electronic device 10 of FIG. 3, housing 12 may have opposing planar front and rear surfaces. Display 14 may be mounted on the front surface of housing 12. As shown in FIG. 3, display 14 may have an opening to accommodate button 26 (as an example).

Figure 4:
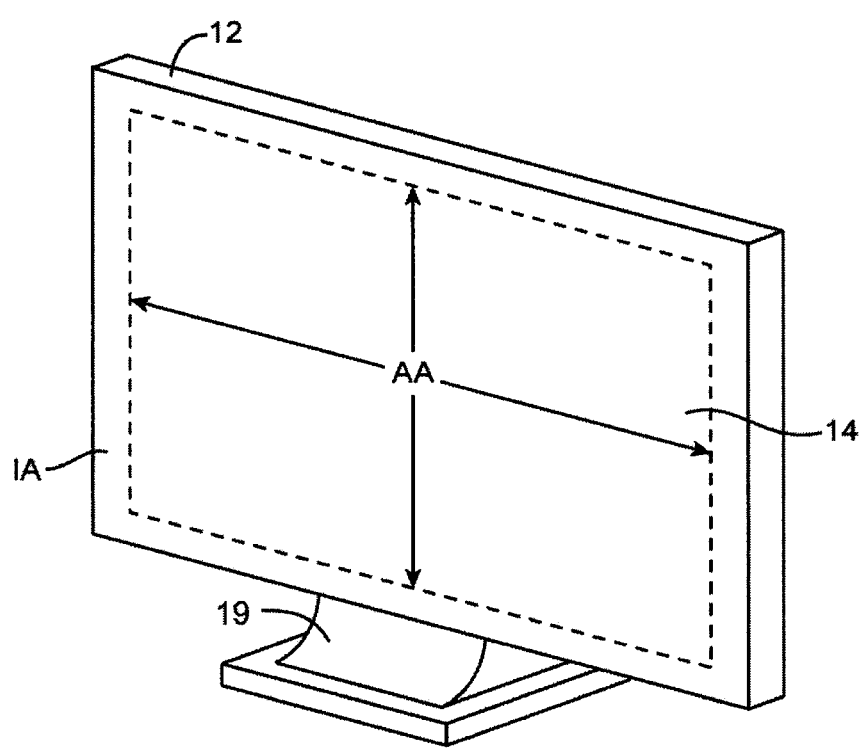
FIG. 4 is a perspective view of an illustrative electronic device such as a computer display with display structures in accordance with an embodiment of the present invention.

FIG. 4 shows how electronic device 10 may be a computer display or a computer that has been integrated into a computer display. With this type of arrangement, housing 12 for device 10 may be mounted on a support structure such as stand 19. Display 14 may be mounted on a front face of housing 12.

The illustrative configurations for device 10 that are shown in FIGS. 1, 2, 3, and 4 are merely illustrative. In general, electronic device 10 may be a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Device 10 may have one or more displays such as display 14. Display 14 may be an organic light-emitting diode (OLED) display or other suitable display. Display 14 may, if desired, include capacitive touch sensor electrodes for a capacitive touch sensor array or other touch sensor structures (i.e., display 14 may be a touch screen). Touch sensor electrodes may be provided on a touch panel layer that is interposed between organic light-emitting diode display structures and a transparent cover layer (e.g., a cover glass layer), may be formed on the underside of a cover layer, or may otherwise be incorporated into display 14.

As shown in FIGS. 1, 2, 3, and 4, display 14 may be characterized by a central active region such as active region AA in which an array of display pixels is used in displaying information for a user. Active region AA may be surrounded by an inactive region such as inactive border region IA. Active region AA may have a rectangular shape. Inactive region IA may have a rectangular ring shape that surrounds active region AA (as an example). Portions of display 14 in inactive region IA may be covered with an opaque masking material such as a layer of black ink (e.g., a polymer filled with carbon black) or a layer of opaque metal. The opaque masking layer may help hide components in the interior of device 10 in inactive region IA from view by a user.

The organic light-emitting diode display structures (sometimes referred to as the OLED display structures, the OLED structures, the organic light-emitting diode structures, the organic light-emitting diode layer, the light-generating layers, the image-generating layers, the display layer, or the image pixel layer) may have a planar rectangular active region in its center that forms active area AA of display 14. The rectangular active region includes an array of organic light-emitting diode pixels. The edges of the organic light-emitting diode layer surround the active center region and form a rectangular peripheral ring. This border region contains circuitry such as signal lines and display driver circuitry that does not emit light and is therefore referred to as the inactive portion of the display. The inactive portion of the display is shown as inactive border region IA in FIGS. 1, 2, 3, and 4.

A portion of the active region in display 14 is shown in FIG. 4. As shown in FIG. 4, the active region may include an array such as array 21 of organic light-emitting diode display pixels 23. Pixels 23 may be arranged in rows and columns in array 21 and may be controlled using a pattern of orthogonal control lines. The control lines in pixel array 21 may include gate lines 27 and data lines 25.

Each pixel may include a light-emitting element such as organic light-emitting diode 31 and associated control circuitry 29. Control circuitry 29 may be coupled to the data lines and gate lines so that control signals such as data line signals and gate line signals may be received from driver circuitry such as a display driver integrated circuit. Data line signals on data lines 25 may be provided to the columns of display pixels 23 in pixel array 21. Gate line signals on gate lines 25 may be provided to the rows of pixels 23 in pixel array 21.

Driver circuitry may include on-display driver circuits such as one or more gate line drivers implemented using low-temperature polysilicon transistors formed in the inactive portion of the display. The driver circuitry may also include a driver integrated circuit. The driver integrated circuit may be mounted in the inactive region of display 14 or may be mounted on a printed circuit or film that is electrically coupled to display 14. The display driver integrated circuit may, for example, be mounted on a polymer film that shares a flexible polymer substrate layer with display 14.

Figure 6:
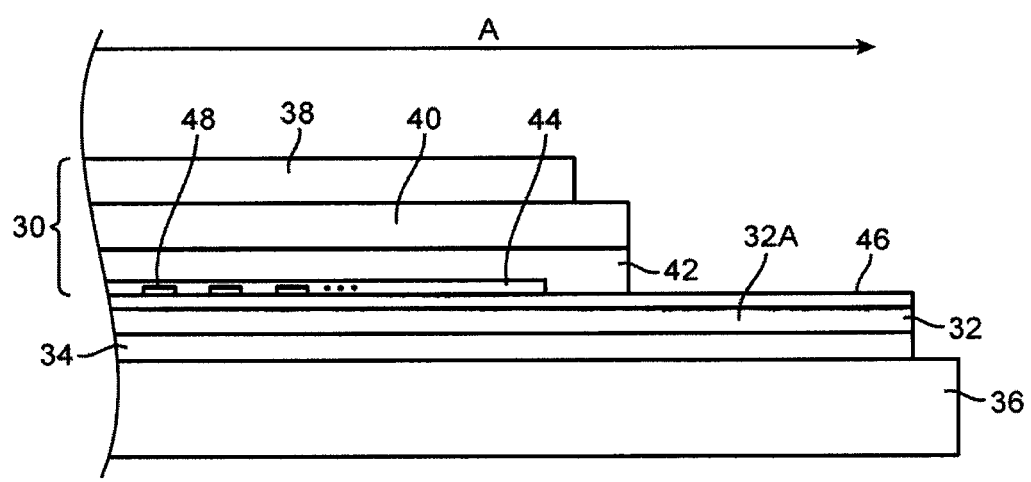
FIG. 6 is a cross-sectional side view of an illustrative display such as an organic light-emitting diode display in accordance with an embodiment of the present invention.

A cross-sectional side view of an illustrative organic light-emitting diode display such as display 14 is shown in FIG. 6. As shown in FIG. 6, display 14 may include image-generating layers such as organic light-emitting diode display structures 30. Display structures 30 may be mounted on a display substrate layer such as display substrate layer 32. Display substrate layer 32 may be mounted on a support layer such as support layer 36 using an adhesive such as adhesive 34.

If desired, additional layers may be included in display 14. For example, display 14 may include a display cover layer (e.g., a flexible or rigid cover layer formed from plastic or glass), a touch-sensitive layer having touch-sensitive circuitry (e.g., capacitive touch electrodes or other touch-sensitive circuitry configured to detect the location of one or more touches or near touches on display 14), and/or other display layers not shown in FIG. 6.

Organic light-emitting diode structures 30 may include multiple layers such as organic emissive layer 44, an adhesive layer such as adhesive layer 42, an encapsulation layer such as encapsulation film layer 40, and a polarizer such as polarizer 38.

Organic emissive layer 44 may include a layer of organic emissive material integrated into a thin-film transistor matrix. The thin-film transistor matrix may include an array of electrodes such as thin-film transistor electrodes 48. Organic emissive material in layer 44 may be formed from organic plastics such as polyfluorene or other organic emissive materials. Encapsulation film layer 40 may be configured to encapsulate organic emissive layer 44. Encapsulation film layer 40 may be formed from a layer of metal foil, metal foil covered with plastic, other metal structures, a glass layer, a thin-film encapsulation layer formed from materials such as silicon nitride, a layered stack of alternating polymer and ceramic materials, a layered stack of alternating polymer and ceramic materials, or other suitable material for encapsulating organic emissive material 44. Encapsulation layer 40 protects organic emissive material 44 from environmental exposure by preventing water and oxygen from reaching organic emissive materials within display 14.

Image light from the organic light-emitting diode pixels in layer 44 is emitted upwards through adhesive 42, encapsulation film 40, and polarizer 38. Polarizer 38 may be a circular polarizer configured to suppress reflections from the metal signal lines in layer 44 that might otherwise be visible to a user.

Thin-film transistor circuitry 48 may be formed on the surface of a display substrate such as display substrate layer 32. If desired, a passivation layer such as passivation layer 46 may be formed on the surface of display substrate layer 32 (e.g., interposed between organic emissive layer 44 and display substrate layer 32). Display substrate layer 32 may be mounted on support structure 36.

Display substrate layer 32 and support structure 36 may be polymer-based layers formed from thin plastic films. Examples of materials that may be used to form display substrate layer 32 and/or support structure 36 include polyimide, polyethylene naphthalate (PEN), polyethylene terephthalate (PET), other suitable polymers, a combination of these polymers, etc. Other suitable substrate materials that may be used to from layer 32 and/or layer 36 include glass, metal foil covered with a dielectric, a multi-layer polymer stack, a thin glass film bonded to a thin polymer, a polymer composite film comprising a polymer material combined with nanoparticles or microparticles dispersed therein, etc. In one suitable arrangement that is sometimes described herein as an example, display substrate layer 32 is formed from a layer of polyimide. Polyimide layer 32 may have a thickness of 10-25 microns, 14-40 microns, 15-20 microns, or more than 5 microns.

Figure 5:
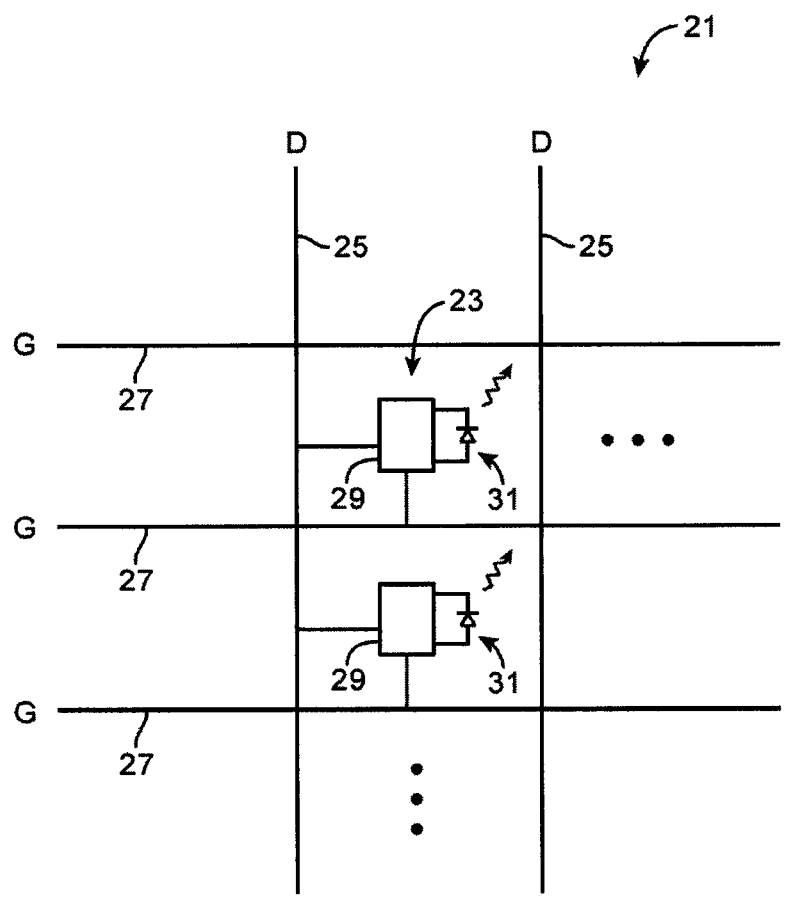
FIG. 5 is a circuit diagram of a portion of an illustrative pixel array that may be used in a display of the type shown in FIGS. 1-4 in accordance with an embodiment of the present invention.

Thin-film transistor circuitry 48 may receive control signals via signal lines in layer 44 (e.g., via gate lines 27 and data lines 25 of FIG. 5). Signals applied to the thin-film transistors in organic emissive layer 44 selectively cause portions of emissive layer 44 to emit display light and thereby display images on display 14 in the active area.

In conventional electronic devices, a display driver integrated circuit is mounted in the inactive area of a display. The inactive area includes space for fanning out control lines from a centralized location at which a signal cable for the driver circuitry is attached. The signal cable routes signals from a main logic board or other printed circuit board to the driver circuitry. Typically, a conductive adhesive is used to mount one end of the signal cable to the display. A board-to-board connector is often used to connector the opposing end of the signal cable to the main logic board. This type of configuration often requires a significant amount of inactive border area and can also lead to a bulky and aesthetically unappealing device. Moreover, connecting structures such as adhesive attachment structures increase the risk of disconnection between parts which in turn can lead to display failure.

To minimize the inactive area of a display while also reducing the need for connecting structures such as adhesives and board-to-board connectors, a polymer substrate layer such as flexible polymer substrate layer 32 may extend beyond the edge of support layer 36 and may be used as a substrate layer for additional structures such as polymer films having photolithographically patterned traces and flexible printed circuits (e.g., flexible printed circuits having traces, vias, hot bar pads, etc.). By using a single contiguous layer of flexible polymer such as polyimide as a base layer (e.g., a substrate layer) for multiple structures in device 10, the need for additional connecting structures and the risk of unintentional disconnections may be minimized.

As shown in FIG. 6, region A of flexible polymer substrate 32 forms a substrate layer in display 14. Region A of flexible polymer substrate layer 32 may sometimes be referred to as flexible polymer substrate layer 32A. Organic light-emitting diode pixels 23 (FIG. 5) may be formed on flexible polymer substrate layer 32A (i.e., region A of flexible polymer substrate layer 32).

Figure 7:
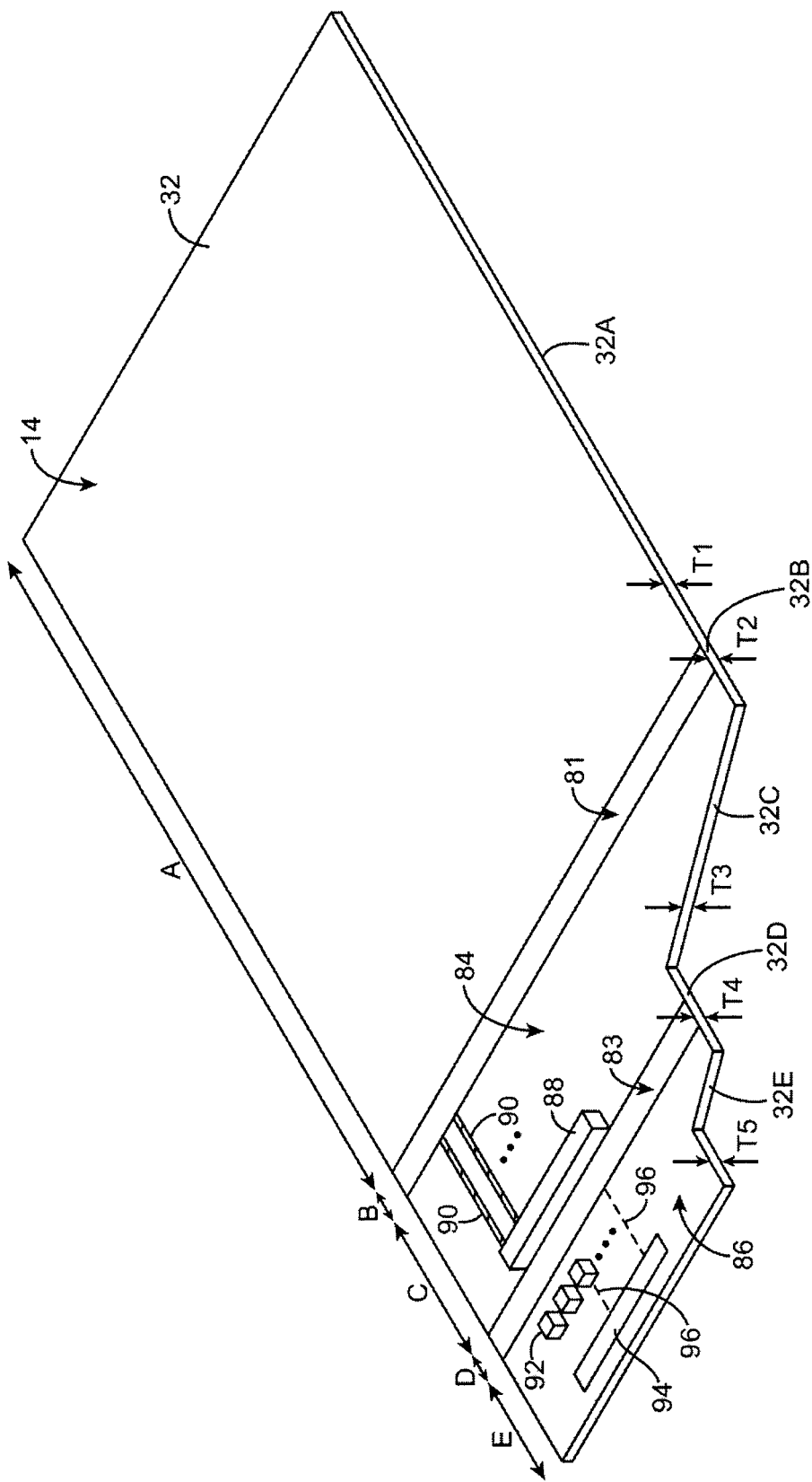
FIG. 7 is a perspective view of a display, a first transition region, a polymer film, a second transition region, and a flexible printed circuit that share a flexible polymer substrate layer in accordance with an embodiment of the present invention.

FIG. 7 shows how flexible polymer substrate layer 32 may form a layer in additional structures such as a polymer film and a flexible printed circuit. As shown in FIG. 7, portion 32A of substrate layer 32 forms a layer in display 14 (region A), portion 32C of substrate layer 32 forms a layer in polymer film 84 (region C), and portion 32E of substrate layer 32 forms a layer in flexible printed circuit 86 (region E). Portion 32B of substrate layer 32 forms a layer in transition region 81 (region B) where display 14 transitions into polymer film 84. Portion 32D of substrate layer 32 forms a layer in transition region 83 (region D) where polymer film 84 transitions into flexible printed circuit 86.

Figure 8:
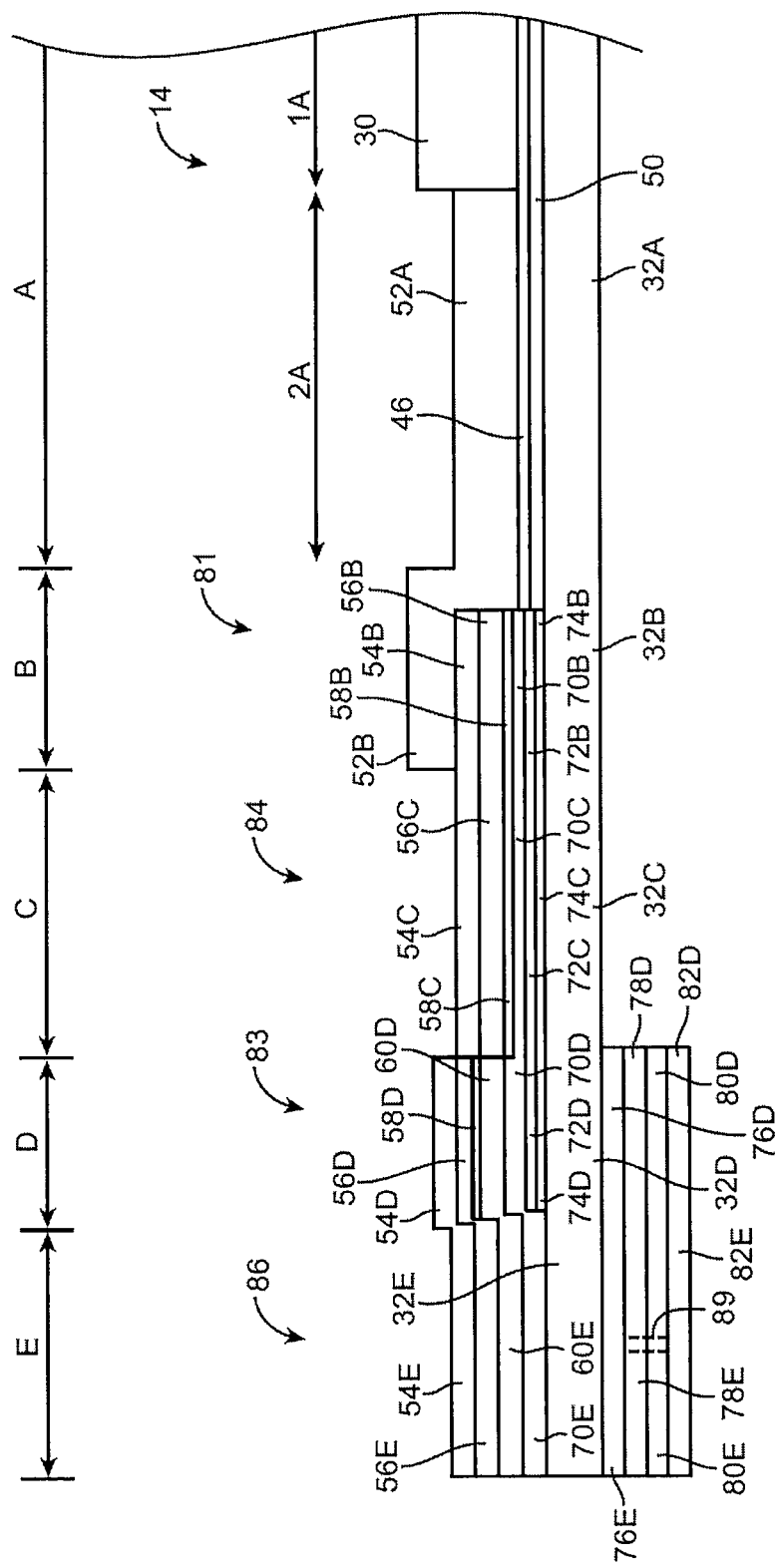
FIG. 8 is a cross-sectional side view of a portion of a display, a first transition region, a polymer film, a second transition region, and a flexible printed circuit that share a flexible polymer substrate layer in accordance with an embodiment of the present invention.

For simplicity, FIG. 7 does not show the individual layers that make up display 14, transition region 81, polymer film 84, transition region 83, and flexible printed circuit 86. However, it should be understood that display 14 includes additional layers and structures coupled to region A of substrate layer 32 (sometimes referred to herein as substrate layer 32A); transition region 81 includes additional layers and structures coupled to region B of substrate layer 32 (sometimes referred to herein as substrate layer 32B); polymer film includes additional layers and structures coupled to region C of substrate layer 32 (sometimes referred to herein as substrate layer 32C); transition region 83 includes additional layers and structures coupled to region D of substrate layer 32 (sometimes referred to herein as substrate layer 32D); and flexible printed circuit includes additional layers and structures coupled to region E of substrate layer 32 (sometimes referred to herein as substrate layer 32E). The individual layers that make up display 14 are described in the illustrative configuration of FIG. 6. The individual layers that make up transition region 81, polymer film 84, transition region 83, and flexible printed circuit 86 are shown in FIG. 8 and will be described in greater detail in connection with FIG. 8.

Because display 14, polymer film 84, flexible printed circuit 86, and transition regions 81 and 83 are formed from different layers and different combinations of layers, display 14, polymer film 84, flexible printed circuit 86, and transition regions 81 and 83 may have different thicknesses. For example, display 14 may have a thickness T1 (in a first region of display 14), transition region 81 may have a thickness T2, polymer film 84 may have a thickness T3, transition region 83 may have a thickness T4, and flexible printed circuit 86 may have a thickness T5.

Thickness T1 of display 14 may, for example, be between 0.3 mm and 0.5 mm, between 0.1 mm and 0.9 mm, between 0.4 mm and 0.6 mm, less than 1.0 mm, or greater than 1.0 mm. Thickness T2 of transition region 81 may, for example, be between 0.08 and 0.12, between 0.05 and 0.15, less than 0.2 mm, or greater than 0.2 mm. Thickness T3 of polymer film 84 may, for example, be between 0.05 mm and 0.09 mm, between 0.03 mm and 0.1 mm, less than 0.1 mm, or greater than 0.1 mm. Thickness T4 of transition region 83 may, for example, be between 0.1 mm and 0.15 mm, between 0.05 mm and 0.2 mm, between 0.8 mm and 0.3 mm, between 0.1 mm and 0.2 mm, less than 0.3 mm, or greater than 0.3 mm. Thickness T5 of flexible printed circuit 86 may, for example, be between 0.1 mm and 0.15 mm, between 0.08 mm and 0.2 mm, less than 0.2 mm, or greater than 0.2 mm.

As shown in FIG. 7, display control circuitry such as display driver integrated circuit 88 may be mounted on polymer film 84 in region C of substrate 32. Metal traces such as photolithographically patterned traces 90 may be formed on substrate layer 32C. Display driver integrated circuit 88 may be mounted to traces 88. Traces 88 may be used to convey electrical signals between display 14 and display driver integrated circuit 88 (e.g., between organic light-emitting diode pixel array 21 of FIG. 5 and display driver integrated circuit 88). Polymer film 84 may be flexible and may be configured to bend about a bend axis. In one suitable embodiment, polymer film 84 makes a 180° bend such that polymer film 84 overlaps itself (e.g., in a U-shaped or C-shaped bend). If desired, display driver integrated circuit 88 may be mounted before the bend (e.g., to lie in the same plane as display 14), in the bend (e.g., in a portion of polymer film 84 that runs perpendicular or nearly perpendicular to display 14), or after then bend (e.g., such that a portion of display 14 overlaps circuit 88). Bending polymer substrate layer 32 in this way may help minimize the inactive border of display 14.

Electrical components such as components 92 may be mounted on flexible printed circuit 86. Components 92 may include integrated circuits, discrete components such as resistors, capacitors, and inductors, and other electronic components. Flexible printed circuit 86 may include patterned conductive traces 96 (e.g., conductive traces on flexible sheets of substrate such as polyimide sheets). Patterned conductive traces 96 may form signal lines that convey signals from a printed circuit board in device 10 (e.g., from integrated circuits or other components on a main logic board in device 10) to display circuitry such as display driver circuitry 88 on polymer film 84. Driver circuitry 88 may distribute signals to the display pixels of display 14 via traces such as traces 90. Flexible printed circuit 86 may also include a hot bar pad such as hot bar pad 94 for electrically connecting traces 96 to a printed circuit board (e.g., a main logic board or other suitable printed circuit in device 10).

Display 14, polymer film 84, and flexible printed circuit 86 share a common substrate layer (layer 32). Display 14, polymer film 84, and flexible printed circuit 86 may have additional shared layers and/or may each have additional layers that are unique to that structure. For example, display 14 may have layers that are located only in portion A of substrate 32, polymer film 84 may have layers that are located only in portion C of substrate 32, and flexible printed circuit 86 may have layers that are located only in portion E of substrate 32.

A cross-sectional side view of flexible printed circuit 86, transition region 83, polymer film 84, transition region 81, and a portion of display 14 is shown in FIG. 8. As shown in FIG. 8, flexible printed circuit 86, transition region 83, polymer film 84, transition region 81, and display 14 each include a portion of substrate layer 32. In each of regions A, B, C, D, and E, additional layers and/or structure are coupled to substrate layer 32.

Display 14, for example, includes region 1A and region 2A. In region 1A, light-emitting diode display structures 30 may be coupled to substrate layer 32A. A passivation layer such as passivation layer 46 and a buffer layer such as buffer layer 50 may be interposed between light-emitting diode display structures 30 and substrate layer 32A. In region 2A, an optional layer of flexible polymer 52A may be formed on the surface of passivation layer 46 and buffer layer 50.

Polymer layer 52A may, for example, be a layer of polyimide, polyethylene naphthalate (PEN), polyethylene terephthalate (PET), other suitable polymers, a combination of these polymers, etc. Optional polymer layer 52A may be used to adjust the location of the neutral plane in regions of polymer layer 32 that are bent. For example, in arrangements where polymer layer 32 bends around a bend axis, the presence of additional polymer layer 52A may move the location of the neutral plane in the bent portion outward, thereby minimizing the risk of damage to the bent portion.

Transition region 81 (which includes region B of substrate layer 32) may include layers that are shared with polymer film 84 in region C and layers that are shared with display 14 in region A. For this reason, transition region 81 may be thicker than region 2A of display 14 and may be thicker than polymer film 84.

As shown in FIG. 8, transition region 81 includes metal layers such as metal layer 74B, metal layer 72B, metal layer 70B, and metal layer 58B. Metal layer 74B may, for example, be a tie-coat layer (e.g., a nickel-chromium tie-coat). Metal layer 72B may be a layer of copper seed, metal layer 70B may be a layer of copper, and metal layer 58B may be a layer of tin plating (as examples). A layer of adhesive such as adhesive 56B may be formed over tin plating 58B, and a layer of coverlay such as coverlay 54B may be formed over adhesive 56B. Metal layers 74B, 72B, 70B, and 58B, adhesive 56B, and coverlay 54B may be interposed between polymer substrate layer 32B and optional polymer layer 52B.

Some of the layers of transition region 81 are shared with polymer film 84 and some of the layers of transition region 81 are not shared with polymer film 84. For example, as shown in FIG. 8, polymer film 84 also includes metal layers such as metal layer 74C, metal layer 72C, metal layer 70C, and metal layer 58C. Metal layer 74C may, for example, be a tie-coat layer (e.g., a nickel-chromium tie-coat). Metal layer 72C may be a layer of copper seed, metal layer 70C may be a layer of copper, and metal layer 58C may be a layer of tin plating (as examples). A layer of adhesive such as adhesive 56C may be formed over tin plating 58C, and a layer of coverlay such as coverlay 54C may be formed over adhesive 56C. Polymer film 84 does not necessarily include additional polymer layer 52.

Transition region 83 (which includes region D of substrate layer 32) may include layers that are shared with polymer film 84 in region C and layers that are shared with flexible printed circuit 86 in region E. For this reason, transition region 83 may be thicker than polymer film 84 and may be thicker than flexible printed circuit 86.

As shown in FIG. 8, transition region 83 includes layers coupled to a first surface of substrate 32D and layers coupled to a second opposing surface of substrate 32D. For example, metal layers such as metal layer 74D, metal layer 72D, metal layer 70D, metal layer 60D, and metal layer 58D may be coupled to a first surface of substrate 32D. Metal layer 74D may, for example, be a tie-coat layer (e.g., a nickel-chromium tie-coat). Metal layer 72D may be a layer of copper seed, metal layer 70B may be a layer of copper, metal layer 60D may be a layer of copper plating, and metal layer 58D may be a layer of tin plating (as examples). A layer of adhesive such as adhesive 56D may be formed over copper plating 60D, and a layer of coverlay such as coverlay 54D may be formed over adhesive 56D.

Additional layers such as metal layer 76D, adhesive layer 78D, coverlay 80D, and metal layer 82D may be formed on an opposing surface of substrate layer 32D (e.g., substrate layer 32D may be interposed between metal layer 74D and metal layer 76D). Metal layer 76D may, for example, be a layer of copper and metal layer 82D may be a metal shield film (e.g., a shields film formed from silver or other suitable metals).

Some of the layers of transition region 83 are shared with flexible printed circuit 86 and some of the layers of transition region 83 are not shared with flexible printed circuit 86. For example, as shown in FIG. 8, metal layer 70E, metal layer 60E, adhesive layer 56E, and coverlay 54E may be formed on a first surface of substrate 32E. Metal layer 70E may, for example, be a layer of copper and metal layer 60E may be a layer of copper plating (as examples). Layers in transition region 83 such as tie-coat layer 74D and copper seed layer 72D need not be included in flexible printed circuit 86.

Additional layers such as metal layer 76E, adhesive layer 78E, coverlay 80E, and metal layer 82E may be formed on an opposing surface of substrate 32E (e.g., substrate layer 32E may be interposed between metal layer 70E and metal layer 76E). Metal layer 76E may, for example, be a layer of copper and metal layer 82E may be a metal shield film (e.g., a shields film formed from silver or other suitable metals).

Metal layers in flexible printed circuit 86 may be electrically connected to other metal layers in flexible printed circuit 86 using vertical conductive structures such as conductive vias 89.

If desired, layers that are shared between any two or more of flexible printed circuit 86, transition region 83, polymer film 84, transition region 81, and display 14 may be contiguous layers that are formed in a single processing step or may be non-contiguous layers that are formed in separate processing steps.

Figure 9:
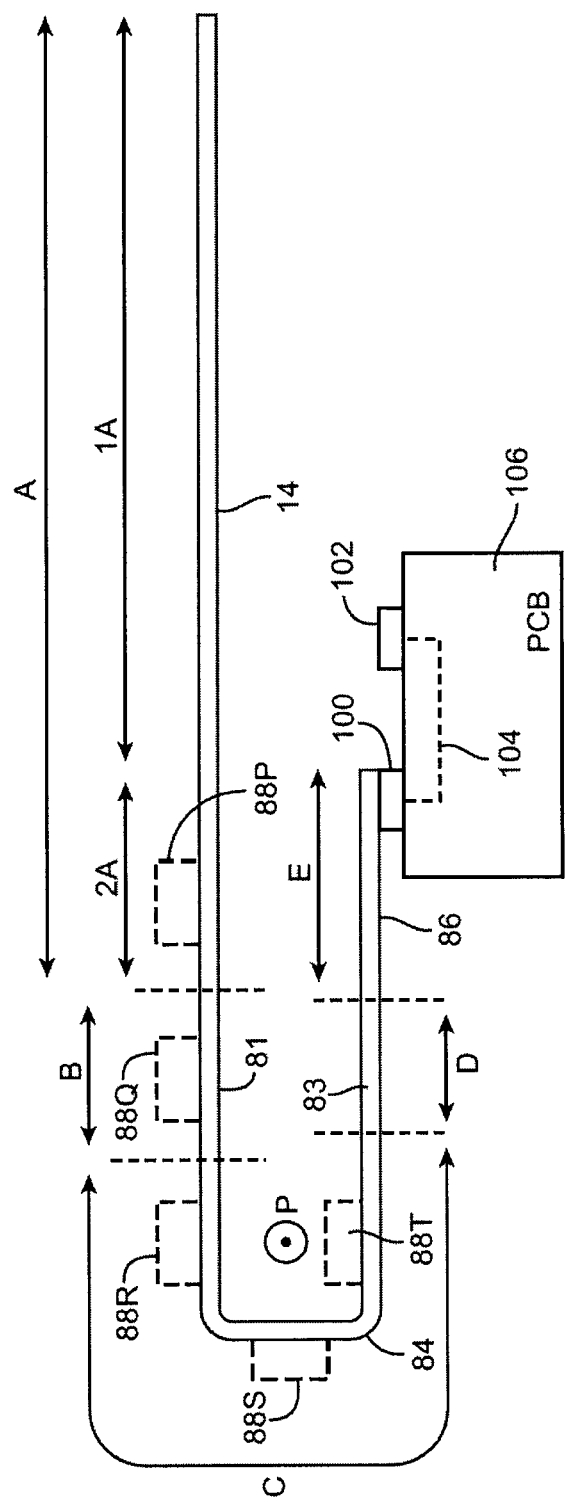
FIG. 9 is a cross-sectional side view a portion of an illustrative electronic device in which a contiguous flexible polymer substrate layer forms part of a display, a polymer film, and a flexible printed circuit and in which the contiguous flexible polymer layer is connected to a printed circuit board using solder in accordance with an embodiment of the present invention.

Some portions of polymer substrate layer 32 may be flat and other portions of polymer substrate layer 32 may be bent or curved. For example, as shown in FIG. 9, polymer film 84 may form a 180 degree bend about bend axis P. Because substrate layer 32 forms a layer in polymer film 84, substrate layer 32 may also form a 180 degree bend about bend axis P.

For simplicity, FIG. 9 does not show the individual layers that make up display 14, transition region 81, polymer film 84, transition region 83, and flexible printed circuit 86. However, it should be understood that display 14 includes additional layers and structures coupled to region A of substrate layer 32; transition region 81 includes additional layers and structures coupled to region B of substrate layer; polymer film includes additional layers and structures coupled to region C of substrate layer 32; transition region 83 includes additional layers and structures coupled to region D of substrate layer 32; and flexible printed circuit includes additional layers and structures coupled to region E of substrate layer 32. The individual layers that make up display 14, transition region 81, polymer film 84, transition region 83, and flexible printed circuit 86 are described in the illustrative configurations of FIGS. 6 and 8.

The use of a shared substrate layer in display 14, transition region 81, polymer film 84, transition region 83, and flexible printed circuit 86 offers flexibility in the location in which display driver integrated circuit 88 is mounted. In one suitable embodiment, display driver integrated circuit 88 may be mounted in region 2A of display 14, as indicated by display driver integrated circuit 88P. Display driver integrated circuit 88P may be mounted to traces that are electrically coupled to traces on polymer film 84 (e.g., photolithographically patterned traces 90 of FIG. 7). Traces 90 on polymer film 84 may be electrically coupled to traces on flexible printed circuit 86 such as traces 96 of FIG. 7. Traces 96 on flexible printed circuit 86 may in turn be electrically coupled to traces 104 on printed circuit 106 (e.g., a main logic board or other suitable printed circuit) via solder 100 (e.g., a hot bar solder connection).

Printed circuit 106 may, for example, be a rigid printed circuit board formed from a material such as fiberglass-filled epoxy (e.g., FR4), may be a flexible printed circuit formed from materials such as polyimide (sometimes referred to as a "flex circuit"), or may be formed from other suitable materials or combinations of these materials. If desired, printed circuit 106 may be a "rigid-flex" printed circuit that includes both rigid and flexible layers. Integrated circuits, discrete components such as resistors, capacitors, and inductors, and other electronic components 102 may be mounted to PCB 106. Traces 104 may be used to convey electrical signals between components 102 and traces 96 on flexible printed circuit 86 via hot bar solder connection 100.

In another suitable embodiment, display driver integrated circuit 88 may be mounted in transition region 81, as indicated by display driver integrated circuit 88Q. Display driver integrated circuit 88Q may be mounted to traces on transition region 81 (e.g., traces 90 on polymer film 84 that extend into transition region 81). Signals may be conveyed between circuit 88Q and components such as component 102 on PCB 106 via traces 90 on polymer film 84, traces 96 on flexible printed circuit 86, hot bar solder connection 100, and traces 104 in PCB 106.

In another suitable embodiment, display driver integrated circuit 88 may be mounted on polymer film 84. As shown in FIG. 9, circuit 88 may be mounted on polymer film 84 before polymer film 84 bends around bend axis P (as shown by circuit 88R), may be mounted on polymer film 84 in the bent region of polymer film 84 (e.g., in the portion of film 84 that runs perpendicular or nearly perpendicular to display 14, as indicated by circuit 88S), or may be mounted on polymer film 84 after polymer film 84 wraps around bend axis P (e.g., in the portion of film 84 that extends underneath display 14, as indicated by circuit 88T). Display driver integrated circuit 88 (e.g., circuit 88R, 88S, or 88T) may be mounted to traces 90 on polymer film 84. Signals may be conveyed between circuit 88 and components such as component 102 on PCB 106 via traces 90 on polymer film 84, traces 96 on flexible printed circuit 86, hot bar solder connection 100, and traces 104 in PCB 106.

Figure 10:
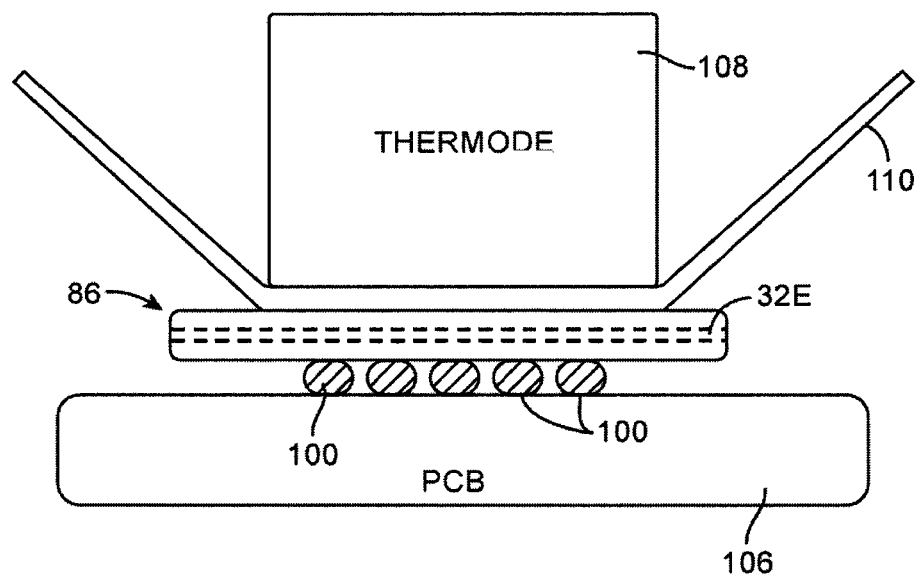
FIG. 10 is a diagram illustrating how a flexible printed circuit that shares a layer with a display may be soldered to a printed circuit board using hot bar soldering tools in accordance with an embodiment of the present invention.

A diagram illustrating how flexible printed circuit 86 may be electrically connected to PCB 106 is shown in FIG. 10. As shown in FIG. 10, patterned solder paste may be formed on the surface of PCB 106 and may be interposed between PCB 106 and flexible printed circuit 86. A heated tool such as thermode 108 may be brought into proximity of patterned solder paste 100. If desired, a protection structure such as polymer-based protection structure 100 may optionally be interposed between thermode 108 and flexible printed circuit 86 to avoid contamination of thermode 108. The proximity of heated tool 108 may heat and reflow solder paste 100. As the solder paste is heated and reflows, hot bar solder joints may be formed to electrically and mechanically couple printed circuit 86 to PCB 106. Hot bar solder joints 100 may be used in forming electrical connections between traces on PCB 106 (e.g., traces 104 of FIG. 9) and traces on flexible printed circuit 86 (e.g., traces 96 of FIG. 7).

The foregoing is merely illustrative of the principles of this invention and various modifications can be made by those skilled in the art without departing from the scope and spirit of the invention.

What is claimed is:

1. An electronic device, comprising:
   a display having an array of display pixels;
   a polymer film having a first plurality of metal traces;
   a flexible printed circuit having a second plurality of metal traces, wherein the display, the polymer film, and the flexible printed circuit share a flexible polymer substrate layer having a bend; and
   a display driver integrated circuit mounted on the polymer film.

2. The electronic device defined in claim 1 wherein the display pixels comprise organic light-emitting diode display pixels.

3. The electronic device defined in claim 1 wherein the flexible polymer substrate layer is a contiguous layer of polyimide having a first region that forms a display substrate layer in the display, a second region that forms a polymer film substrate layer in the polymer film, and a third region that forms a flexible printed circuit layer in the flexible printed circuit.

4. The electronic device defined in claim 1 wherein the polymer film comprises at least one layer of metal.

5. The electronic device defined in claim 4 wherein the flexible printed circuit comprises more layers of metal than the polymer film.

6. The electronic device defined in claim 1 wherein the array of display pixels comprises thin-film transistor circuitry formed on the flexible polymer substrate layer.

7. The electronic device defined in claim 1 wherein the polymer film comprises a U-shaped bend.

8. The electronic device defined in claim 1 wherein the first plurality of metal traces comprises photolithographically patterned metal traces.

9. The electronic device defined in claim 1 further comprising:
   a printed circuit board; and
   solder connections between the printed circuit board and the flexible printed circuit.

10. The electronic device defined in claim 9 wherein the solder connections comprise hot bar solder connections.

11. The electronic device defined in claim 1 further comprising a transition region interposed between the polymer film and the flexible printed circuit, wherein the transition region is thicker than the flexible printed circuit.

12. The electronic device defined in claim 11 wherein the transition region is thicker than the polymer film.

13. The electronic device defined in claim 11 further comprising a second transition region interposed between the display and the polymer film, wherein the second transition region is thicker than the polymer film.

14. The electronic device defined in claim 1 wherein the display pixels overlap the display driver integrated circuit.

15. An electronic device, comprising:
   a flexible polymer substrate layer;
   an array of display pixels formed on a first region of the flexible polymer substrate layer;
   a plurality of metal traces in a second region of the flexible polymer substrate layer; and
   a display driver integrated circuit mounted to the plurality of metal traces in the second region of the flexible polymer substrate layer, wherein the flexible polymer substrate layer comprises a bend such that the first region of the flexible polymer substrate layer overlaps the display driver integrated circuit in the second region of the flexible polymer substrate layer, and wherein the flexible polymer substrate layer has a third region that is sandwiched between layers of metal.

16. The electronic device defined in claim 15 wherein the array of display pixels comprises thin-film transistor circuitry formed on the first region of the flexible polymer substrate layer.

17. The electronic device defined in claim 15 wherein the array of display pixels comprises an array of organic light-emitting diode display pixels.

18. An electronic device, comprising:
   a display having an array of display pixels;
   a polymer film having metal traces;
   a display driver integrated circuit mounted to the metal traces, wherein at least a portion of the display overlaps the display driver integrated circuit and wherein the display and the polymer film share a flexible polymer substrate layer; and
   a flexible printed circuit comprising at least first and second conductive layers, wherein the flexible polymer substrate layer is sandwiched between the first and second conductive layers of the flexible printed circuit.

19. The electronic device defined in claim 18 wherein the flexible polymer substrate layer comprises a U-shaped bend.

* * * * *